United States Patent
Ohgishi et al.

(10) Patent No.: US 10,006,975 B2
(45) Date of Patent: Jun. 26, 2018

(54) MAGNETIC RESONANCE IMAGING APPARATUS AND METHOD OF DISPLAYING INFORMATION THEREOF

(75) Inventors: Norifumi Ohgishi, Tokyo (JP); Yukitoshi Shimo, Tokyo (JP)

(73) Assignee: GENERAL ELECTRIC COMPANY, Schenectady, NY (US)

(*) Notice: Subject to any disclaimer, the term of this patent is extended or adjusted under 35 U.S.C. 154(b) by 410 days.

(21) Appl. No.: 13/336,533

(22) Filed: Dec. 23, 2011

(65) Prior Publication Data

US 2013/0162510 A1   Jun. 27, 2013

(51) Int. Cl.
*G01R 33/28* (2006.01)
*G09G 3/34* (2006.01)

(52) U.S. Cl.
CPC ........... *G01R 33/283* (2013.01); *G09G 3/344* (2013.01); *G09G 2330/06* (2013.01); *G09G 2380/14* (2013.01)

(58) Field of Classification Search
None
See application file for complete search history.

(56) References Cited

U.S. PATENT DOCUMENTS

| | | | |
|---|---|---|---|
| 5,028,872 A * | 7/1991 | Nakabayashi | 324/318 |
| 6,184,521 B1 * | 2/2001 | Coffin et al. | 250/237 R |
| 6,259,251 B1 | 7/2001 | Sugiura et al. | |
| 6,297,636 B1 | 10/2001 | Shimo et al. | |
| 6,320,383 B1 | 11/2001 | Kato et al. | |
| 6,441,612 B1 | 8/2002 | Shimo et al. | |
| 7,501,824 B2 | 3/2009 | Kawachi et al. | |
| 8,112,942 B2 * | 2/2012 | Bohm et al. | 52/79.1 |
| 8,358,734 B2 * | 1/2013 | Nakamura et al. | 378/8 |
| 8,509,876 B2 * | 8/2013 | Karmarkar | 600/424 |
| 2009/0093705 A1 * | 4/2009 | Vangdal | 600/410 |
| 2012/0075168 A1 * | 3/2012 | Osterhout et al. | 345/8 |

FOREIGN PATENT DOCUMENTS

| | | |
|---|---|---|
| JP | H08252239 A | 10/1996 |
| JP | 2000298460 A | 10/2000 |
| JP | 2003190112 | 7/2003 |
| JP | 2005000344 A | 1/2005 |
| JP | 2008302214 A | 12/2008 |

* cited by examiner

*Primary Examiner* — Nicholas J Lee
*Assistant Examiner* — Duane N Taylor, Jr.

(57) ABSTRACT

A magnetic resonance imaging apparatus configured to collect magnetic resonance signals from a subject is provided. The apparatus includes a magnetic field generating device, and an electronic paper located at the magnetic field generating device and configured to display predetermined information.

16 Claims, 12 Drawing Sheets

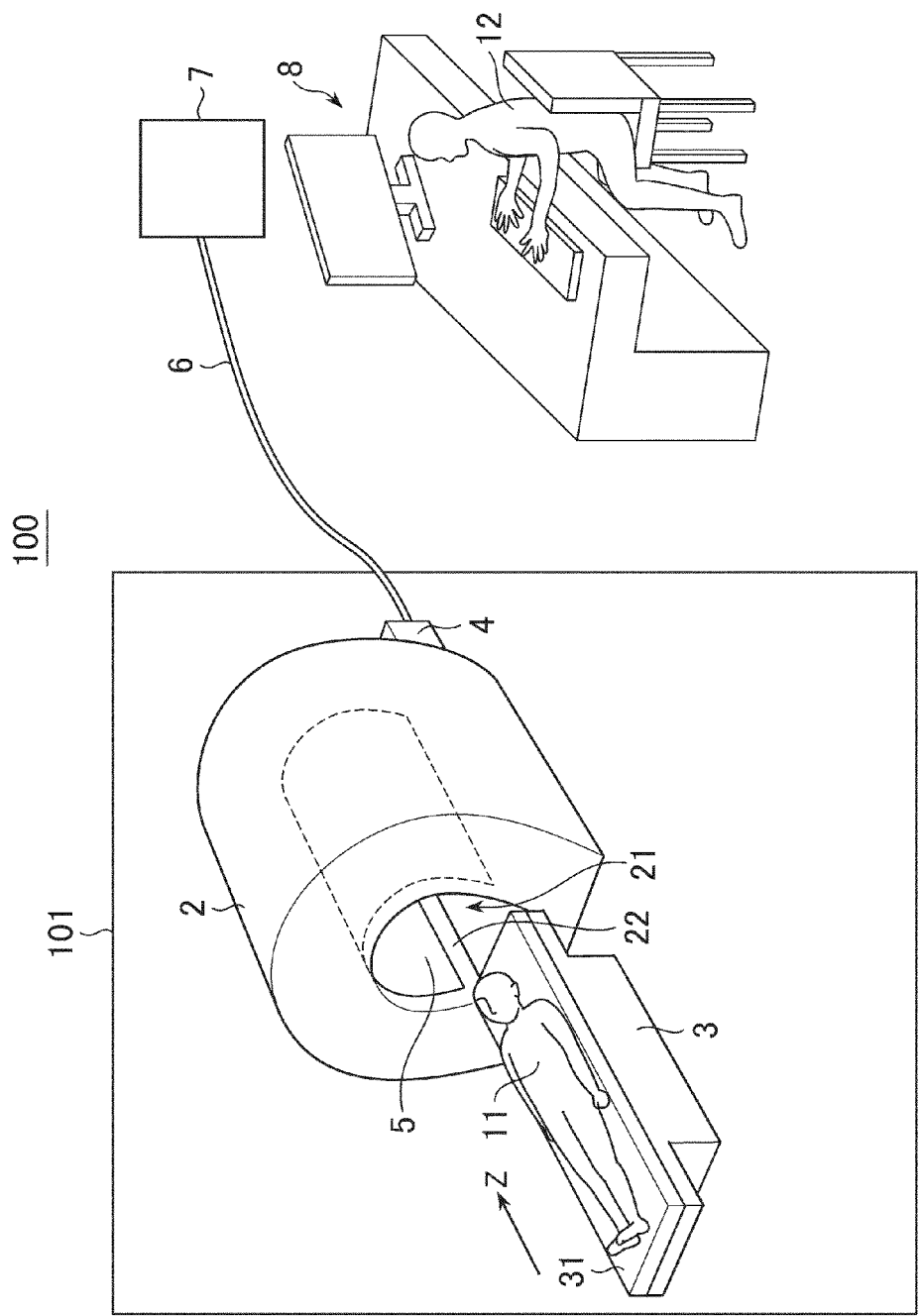

MAGNETIC RESONANCE IMAGING APPARATUS AND METHOD OF DISPLAYING INFORMATION THEREOF

BACKGROUND OF THE INVENTION

The present invention relates to a magnetic resonance imaging apparatus that collects magnetic resonance signals from a subject.

In the case where an image of a subject is obtained by a magnetic resonance imaging apparatus, the subject is carried into a bore. However, in the case where the subject suffers from claustrophobia, it is impossible for the subject to tolerate and continue the imaging in some cases because the bore is a narrow space. Further, in the case where an operator gives necessary instructions to the subject during the imaging, the operator generally gives audio instructions. In the case of a subject with hearing disability, however, it is impossible for the operator to give audio instructions. As a method of solving the above-described problem, there has been known a method of installing a liquid crystal display (LCD) in a bore (for example, refer to Japanese Patent Application Laid-Open No. 2003-190112).

For a subject suffering from claustrophobia, videos that can provide a sense of safety for the subject are displayed on the LCD in the method described in Japanese Patent Application Laid-Open No. 2003-190112. Further, for a subject with hearing disability, necessary instructions are displayed on the LCD. However, strong magnetic fields are generated at and around the bore of the magnetic resonance imaging apparatus. Thus, the LCD cannot be properly operated under the influence of the generated strong magnetic fields, and it is difficult, in fact, to display necessary information (for example, videos and instructions) for the subject. Accordingly, it has been desired to be able to display necessary information for the subject irrespective of the strong magnetic fields of the magnetic resonance imaging apparatus.

SUMMARY OF THE INVENTION

A magnetic resonance imaging apparatus that collects magnetic resonance signals from a subject is provided. The apparatus includes a magnetic field generating device, and an electronic paper that is provided at the magnetic field generating device to display predetermined information.

Information can be displayed for a subject by using an electronic paper.

Advantages of the embodiments described herein will be apparent from the following description of the exemplary embodiments as illustrated in the accompanying drawings.

BRIEF DESCRIPTION OF DRAWINGS

FIG. 1 is a schematic diagram of a magnetic resonance imaging apparatus according to a first embodiment.

DETAILED DESCRIPTION OF THE INVENTION

Figure 2A:
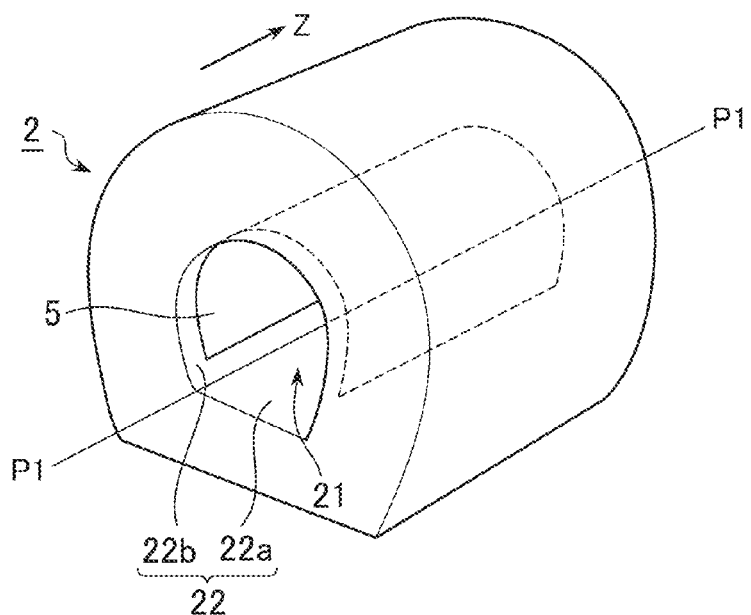
FIGS. 2A and 2B are diagrams illustrating an electronic paper.

Hereinafter, exemplary embodiments will be described, but the invention is not limited to the embodiments specifically described herein.

First Embodiment

FIG. 1 is a schematic diagram of a magnetic resonance imaging apparatus according to a first embodiment.

A magnetic resonance imaging (MRI) apparatus 100 includes a magnetic field generating device 2, tables 3 and 4, and the like in a shield room 101.

The magnetic field generating device 2 includes a tunnel-type accommodation space 21 in which a subject 11 is accommodated. The table 3 is arranged on the front side of the magnetic field generating device 2, and the table 4 is arranged on the rear side of the magnetic field generating device 2. The table 3 includes a cradle 31 on which the subject 11 is placed. Movement of the cradle 31 in the z-direction allows the subject 11 to be carried into the accommodation space 21.

Further, on an inner wall 22 of the accommodation space 21 of the magnetic field generating device 2, attached is an electronic paper 5 that displays, for the subject 11, predetermined information (for example, a remaining scan time, precautions when obtaining an image, and an image that suits the preferences of the subject 11). The electronic paper 5 will be described in detail later.

The MRI apparatus 100 includes, outside the shield room 101, a control device 7, a console 8, and the like for controlling the electronic paper 5. The electronic paper 5 and the control device 7 are connected to each other through a cable 6. An operator 12 operates the console 8 to input information necessary when obtaining an image.

Next, the electronic paper 5 will be described with reference to FIGS. 2A and 2B.

Figure 2B:
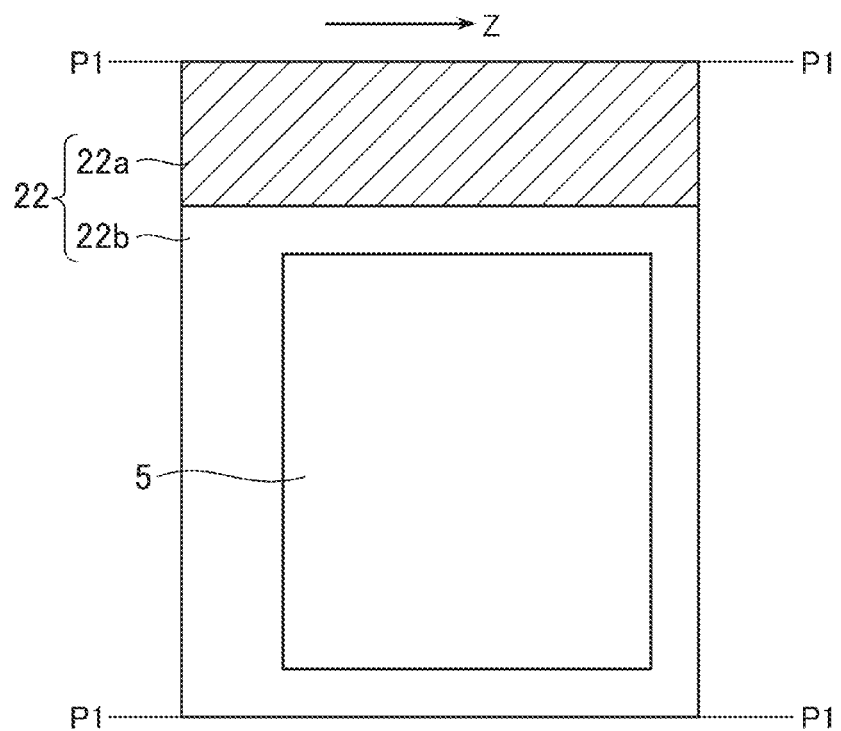

FIGS. 2A and 2B are diagrams each explaining the electronic paper 5.

FIG. 2A is a perspective diagram for showing the magnetic field generating device 2, and FIG. 2B is a diagram obtained by dividing the inner wall 22 of the accommodation space 21 at the position of a line P1 of FIG. 2A and then developing the same to a two-dimensional plane.

The inner wall 22 of the accommodation space 21 includes a support face 22a (shown by diagonal lines in FIG. 2B) for supporting the cradle 31 carried into the accommodation space 21, and a curved face 22b connected to the support face 22a.

The electronic paper 5 is attached so as to cover nearly the entire surface of the curved face 22b of the inner wall 22. The electronic paper 5 is as thin as paper, and can be bent for use. Thus, the electronic paper 5 can be easily attached to the curved face 22b of the inner wall 22.

Figure 3:
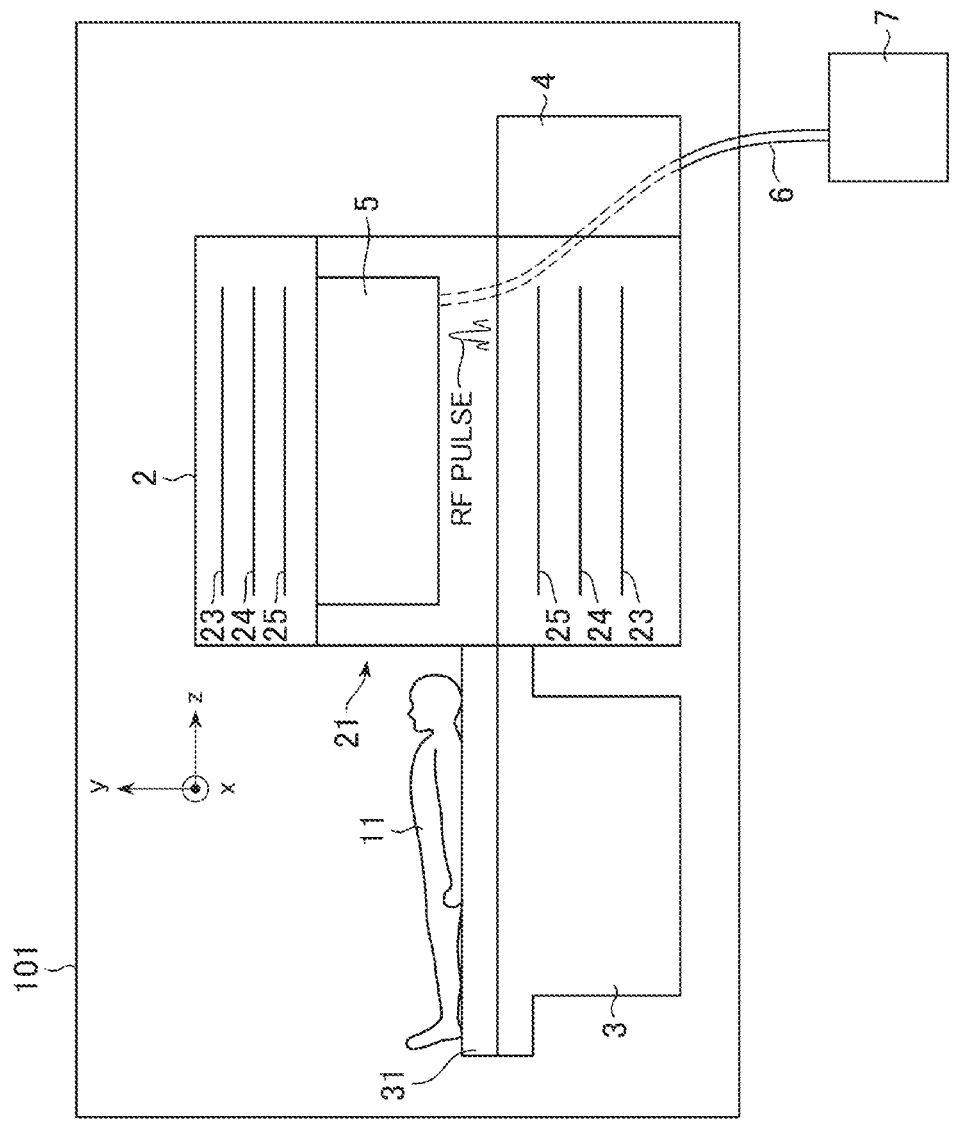
FIG. 3 is a diagram of a magnetic field generating device and tables arranged inside a shield room, and a control device arranged outside the shield room.

FIG. 3 is a diagram for showing the magnetic field generating device 2 and the tables 3 and 4 arranged inside the shield room 101, and the control device 7 arranged outside the shield room 101.

It should be noted that a y-z cross-section of the magnetic field generating device 2 is shown to facilitate understanding of the position of the electronic paper 5.

The magnetic field generating device 2 incorporates therein superconducting coils 23, gradient coils 24, and transmission coils 25. The superconducting coils 23 generate magnetostatic fields, the gradient coils 24 apply gradient fields, and the transmission coils 25 transmit RF pulses. It should be noted that permanent magnets may be used instead of the superconducting coils 23.

The electronic paper 5 attached to the inner wall of the accommodation space 21 is connected to the control device 7 arranged outside the shield room 101 through the cable 6. The electronic paper 5 receives a signal from the control device 7 through the cable 6, and displays, for the subject 11, predetermined information (for example, a remaining scan time, precautions when obtaining an image, and an image that suits the preferences of the subject 11) in response to the signal received from the control device 7. Since the electronic paper 5 is attached to the inner wall 22 of the accommodation space 21, the subject 11 can easily and visually recognize the information displayed on the electronic paper 5 in the accommodation space 21. An example of the information displayed on the electronic paper 5 will be described below.

Figure 4A:
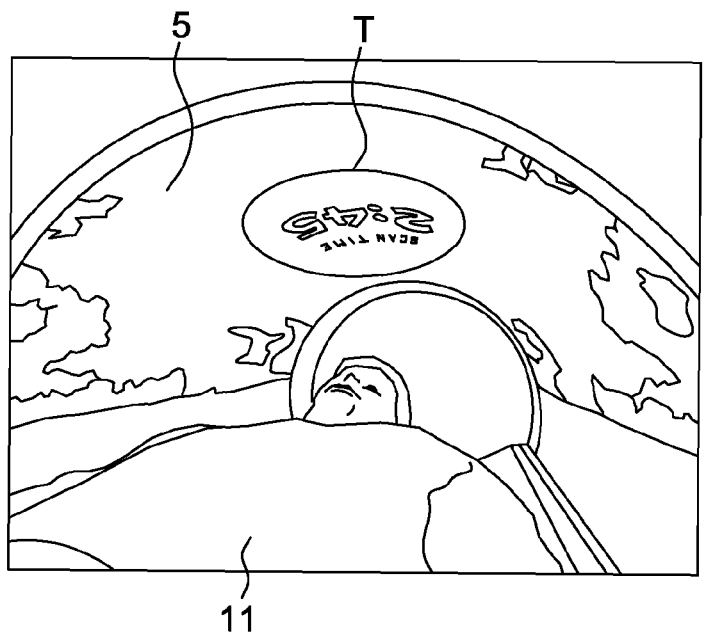
FIGS. 4A and 4B are diagrams illustrating an example of information displayed on the electronic paper
Figure 4B:
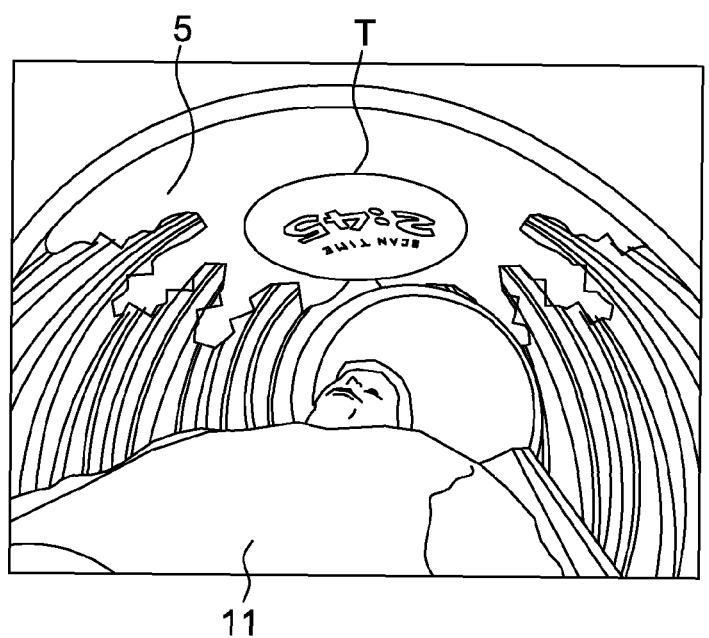

FIGS. 4A and 4B are diagrams each showing an example of the information displayed on the electronic paper 5. Each of FIGS. 4A and 4B shows a state of the electronic paper 5 when viewed from the front side of the accommodation space 21.

In FIG. 4A, the electronic paper 5 displays fields of flowers and a blue sky. Further, the electronic paper 5 displays a remaining scan time T in the blue sky. In addition, in FIG. 4B, the electronic paper 5 displays a forest. Further, the electronic paper 5 displays the remaining scan time T in the forest. Each of FIG. 4A and 4B shows T=2 minutes 45 seconds as an example of the remaining scan time T.

Displaying the fields of flowers and the forest as shown in FIGS. 4A and 4B can reduce a sense of anxiety of a subject 11 suffering from claustrophobia. In addition, since the remaining scan time T is displayed, a subject 11 with hearing disability can visually recognize the remaining scan time T. It should be noted that the information displayed on the electronic paper 5 is not limited to that shown in FIGS. 4A and 4B. For example, in the case where breath-holding scanning is carried out, the breath-holding timing or the remaining time before the breath-holding scanning is finished may be displayed.

Further, a small amount of electric power is required to rewrite the information on the electronic paper 5 as compared to that for a liquid crystal display. Thus, noise is hardly generated. Accordingly, if the information is rewritten during the scanning of the subject 11, a high-quality MR image can be obtained.

It should be noted that an electrophoretic-type electronic paper is used as the electronic paper 5 in the exemplary embodiment. Even if the electrophoretic-type electronic paper is used in strong magnetic fields, the electrophoretic-type electronic paper is relatively unaffected by magnetic fields. Thus, necessary information can be correctly displayed. In order to verify that the electrophoretic-type electronic paper can correctly display necessary information even in strong magnetic fields, an experiment was conducted using the electrophoretic-type electronic paper. The result of the experiment will be described below.

Figure 5:
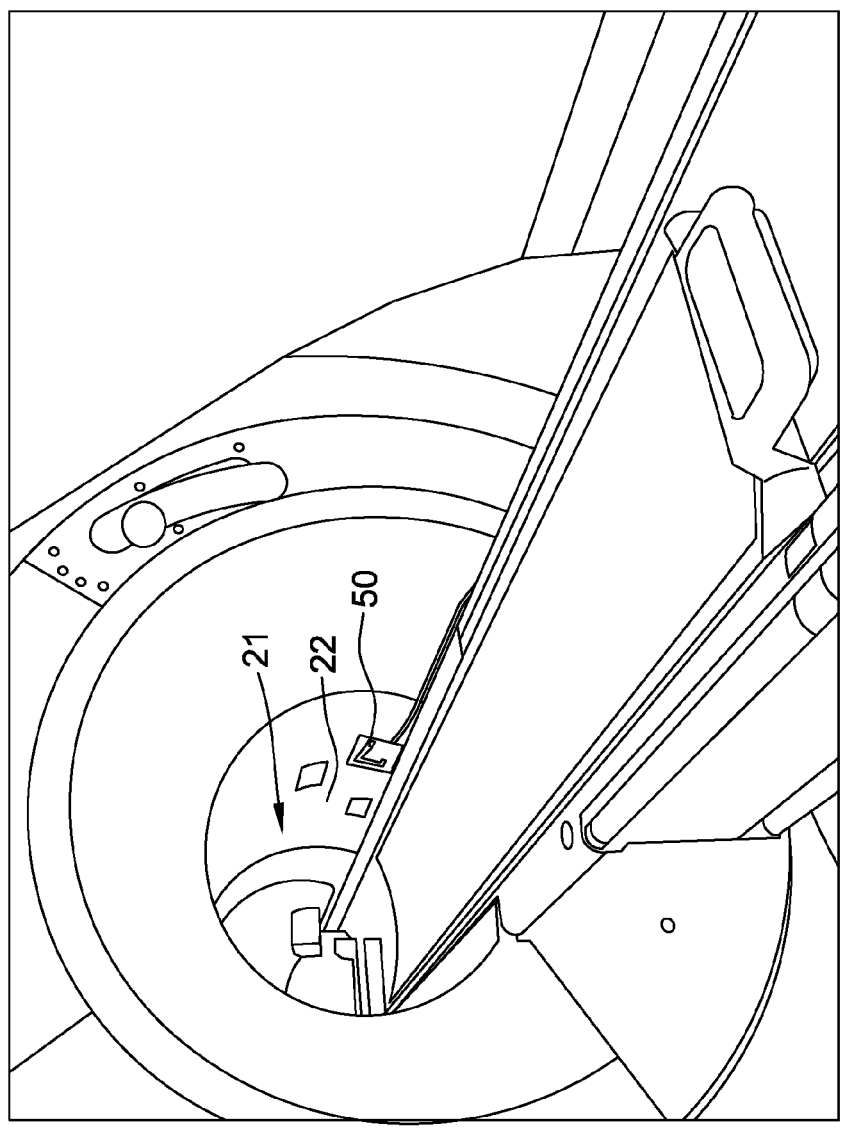
FIG. 5 is a diagram for explaining the result of an experiment.

FIG. 5 is a diagram for explaining the result of the experiment.

In the experiment, the electrophoretic-type electronic paper 50 is attached to the inner wall 22 of the accommodation space 21 of the MRI apparatus, and number "7" is displayed on the electronic paper 50. With reference to FIG. 5, it can be found that number "7" is clearly displayed on the electronic paper 50, and the electrophoretic-type electronic paper can correctly display necessary information even in strong magnetic fields. Further, an electronic paper of a type different from the electrophoretic type may be used as long as the electronic paper is not virtually affected by magnetic fields. However, it may be preferable in some embodiments not to use an electronic paper using a magnetic twisting ball-type device or a magnetic thermal-type device is not used because the electronic paper is not likely to operate properly under the influence of the magnetic fields of the magnetic field generating device 2.

It should be noted that although the accommodation space 21 accommodating the subject is of a tunnel type in the first embodiment, any type of accommodation space, including an open-type accommodation space may be utilized.

Second Embodiment

In the first embodiment, there has been described the MRI apparatus 100 in which the electronic paper 5 is attached to the inner wall 22 of the accommodation space 21. In a second embodiment, there will be described an MRI apparatus in which the electronic paper is attached to an external surface of the magnetic field generating device.

Figure 6:
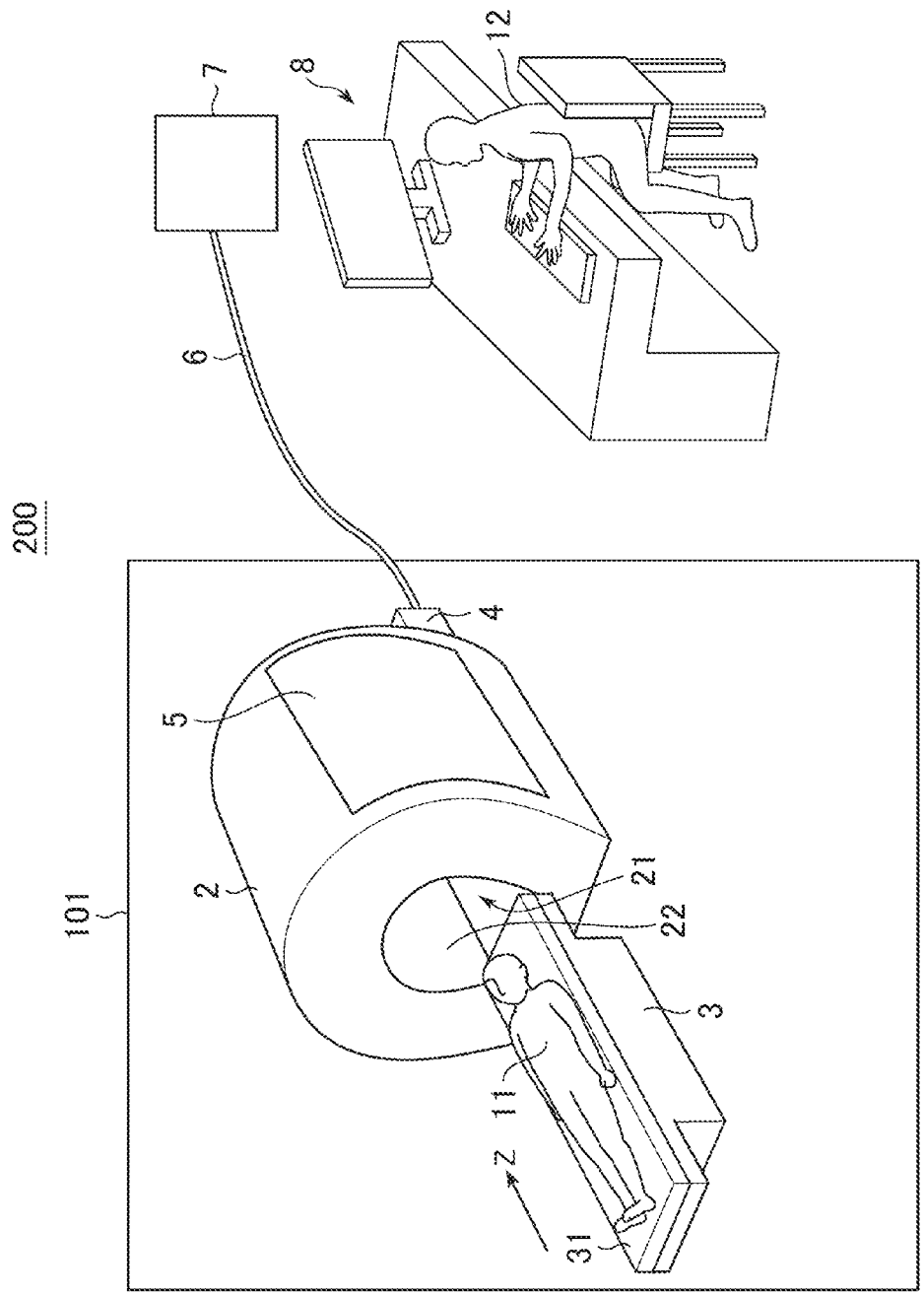
FIG. 6 is a schematic diagram of an MRI apparatus according to a second embodiment
Figure 7:
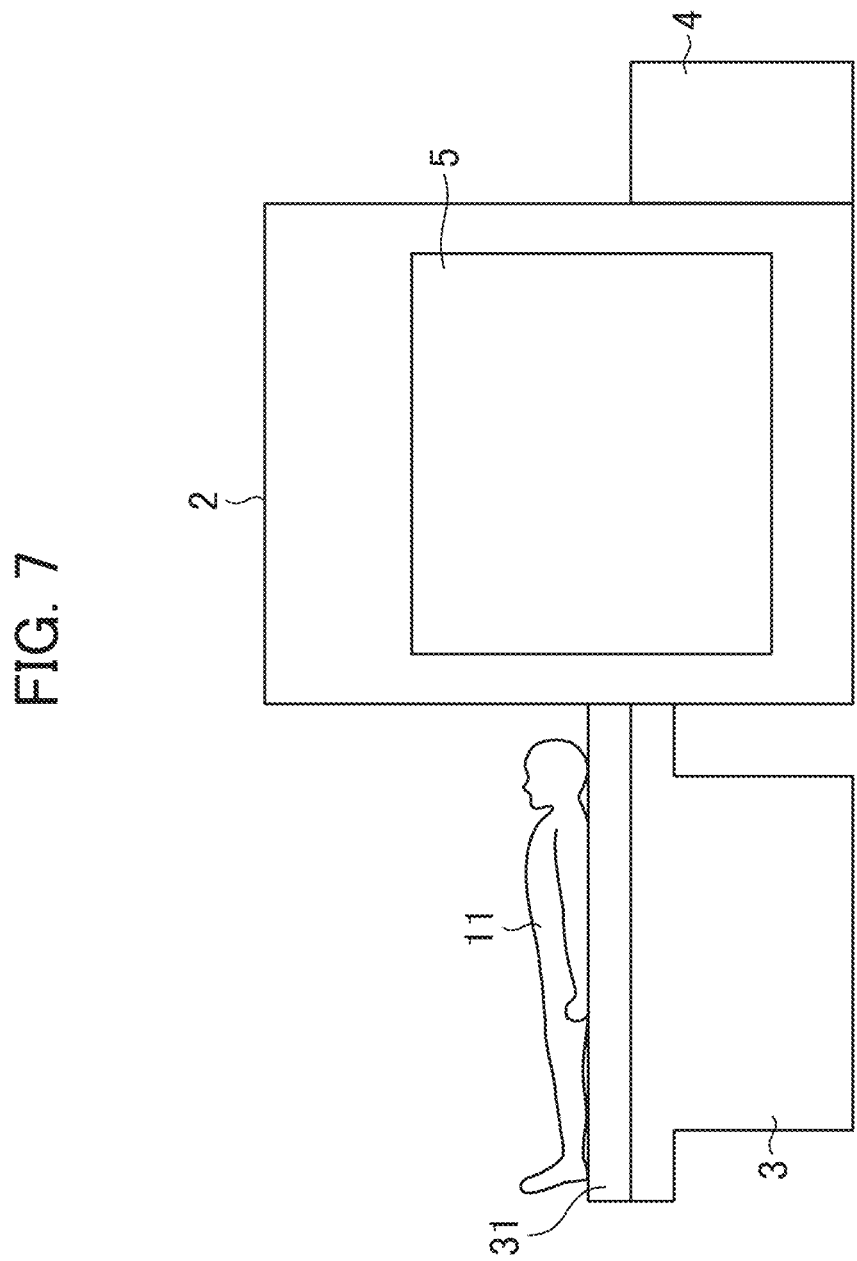
FIG. 7 is a side view of each of the magnetic field generating device and the tables arranged in the shield room shown in FIG. 6.

FIG. 6 is a schematic diagram of an MRI apparatus 200 according to the second embodiment, and FIG. 7 is a side view of each of the magnetic field generating device 2 and the tables 3 and 4 arranged in the shield room 101.

In the MRI apparatus 200 according to the second embodiment, the electronic paper 5 is attached to the external surface of the magnetic field generating device 2, but the other configurations are the same as those of the MRI apparatus 100 according to the first embodiment.

Figure 8:
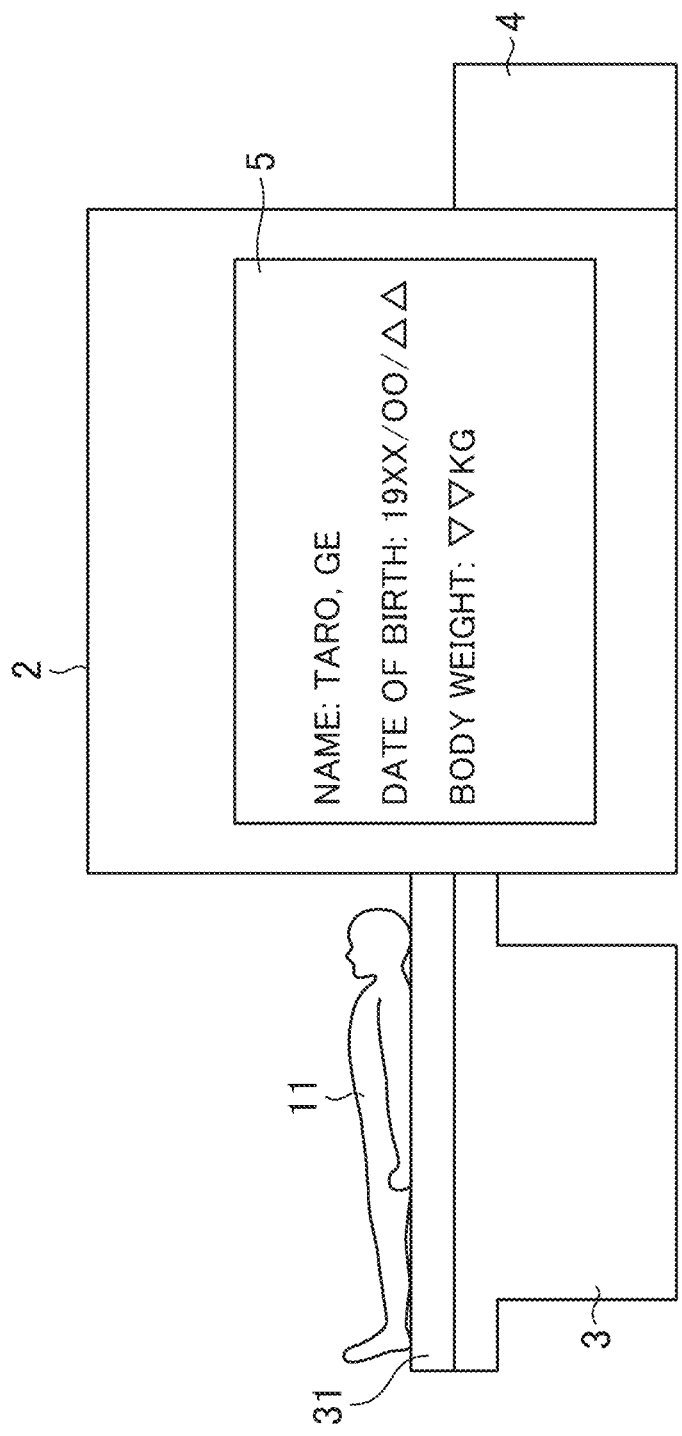
FIG. 8 is a diagram for showing an example of information displayed on the electronic paper.

FIG. 8 is a diagram for showing an example of information displayed on the electronic paper 5.

In the second embodiment, the electronic paper 5 displays personal information (for example, name, date of birth, and body weight) of the subject 11. Displaying the personal information of the subject 11 allows the subject 11 himself/herself to be able to confirm the identification when the subject 11 enters the shield room 101, and it is possible to preliminarily prevent a wrong subject from being inspected. Further, the electronic paper 5 is attached to the external surface of the magnetic field generating device 2, so that the operator 12 also can easily confirm the personal information of the subject 11 displayed on the electronic paper 5. Of the personal information of the subject 11, the body weight of the subject 11 is highly important from the viewpoint of an SAR (Specific Absorption Rate) or the like, and thus it is preferable from the aspect of safety management that the operator 12 can easily confirm the body weight of the subject 11. Further, if the subject 11 is, for example, a child, an image (a cartoon character or the like) that suits the preferences of the subject 11 may be displayed on the electronic paper 5. In the case where the subject 11 is a child, a sense of anxiety of the child can be reduced by displaying an image that suits the preferences of the subject 11 on the electronic paper 5.

Third Embodiment

As shown in FIG. 3, the cable 6 is arranged near the transmission coils 25. Therefore, the RF pulses transmitted by the transmission coils 25 turn to high-frequency noise to possibly reach the control device 7 through the cable 6. If the high-frequency noise reaches the control device 7, there is a possibility that the control device 7 breaks down. Thus, the control device 7 is desirably protected from the high-frequency noise. Accordingly, the cable 6 is configured to protect the control device 7 from the high-frequency noise in an MRI apparatus according to a third embodiment. Hereinafter, the cable 6 of the MRI apparatus according to the third embodiment will be described. It should be noted that the MRI apparatus according to the third embodiment is the same as the MRI apparatus 100 according to the first embodiment except the cable. Thus, the explanation will be given mainly to the cable in the third embodiment.

Figure 9:
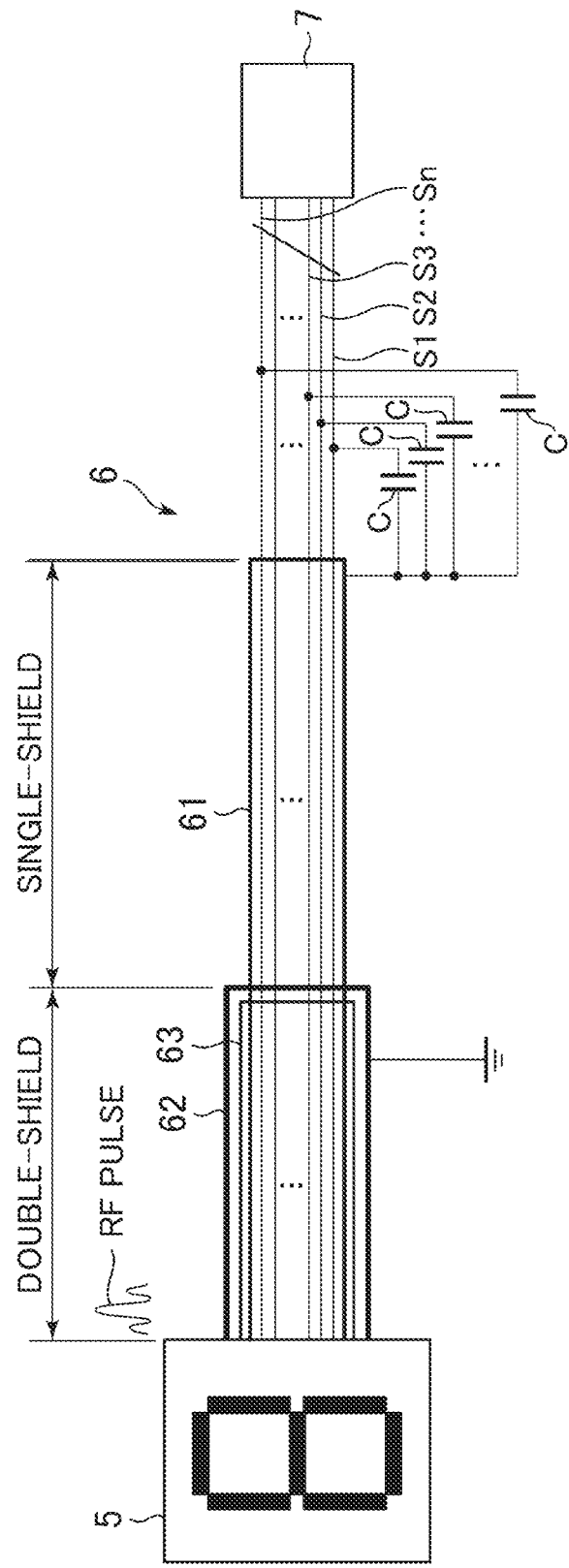
FIG. 9 is a diagram of a cable of an MRI apparatus according to a third embodiment.

FIG. 9 is a diagram for explaining the cable 6 of the MRI apparatus according to the third embodiment.

The cable 6 includes n pieces of signal lines S1 to Sn, an inner shield 61, an outer shield 62, an insulator 63, and capacitors C.

The inner shield 61 is provided so as to cover the signal lines S1 to Sn from the position of the electronic paper 5 to the position near the control device 7. The outer shield 62 is shorter than the inner shield 61, and is provided on the side of the electronic paper 5. The insulator 63 is provided between the inner shield 61 and the outer shield 62. The capacitors C are provided between the inner shield 61 and the respective signal lines S1 to Sn.

The cable 6 according to the third embodiment has not only a single-shield structure of the inner shield 61, but also a double-shield structure of the inner shield 61 and the outer shield 62. Thus, most of the high-frequency noise caused by the RF pulses can be shielded, and can be prevented from being mixed in the signal lines S1 to Sn. It should be noted that the lengths of the inner shield 61 and the outer shield 62 are not limited to those shown in FIG. 9, but may be appropriately changed if necessary. For example, the length of the outer shield 62 may be equal to that of the inner shield 61.

Further, since the cable 6 includes the capacitors C, if the high-frequency noise is mixed in the signal lines S1 to Sn, most of the high-frequency noise mixed in the signal lines S1 to Sn can be eliminated by the capacitors C. Thus, even if the high-frequency noise is mixed in the signal lines S1 to Sn, most of the high-frequency noise mixed in the signal lines S1 to Sn can be eliminated before reaching the control device 7, and the control device 7 can be prevented from breaking down due to the high-frequency noise.

Figure 10:
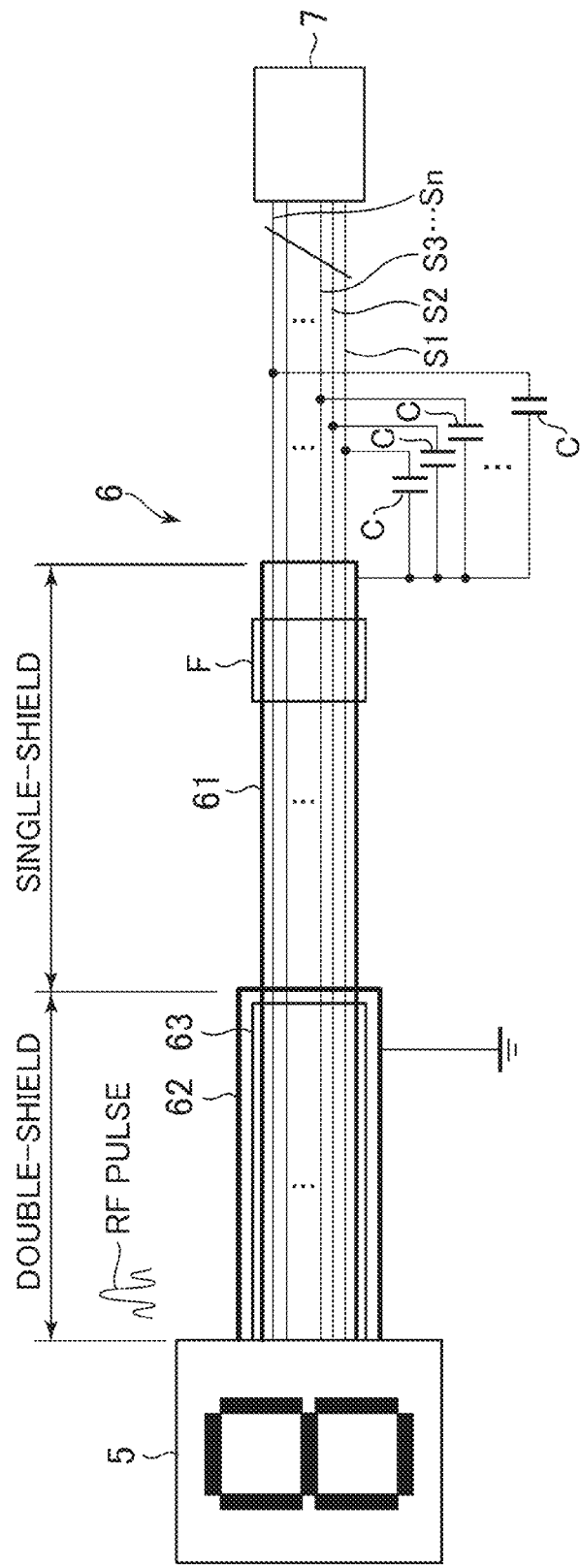
FIG. 10 is a diagram for showing an example of a cable having a ferrite.

In addition, the cable 6 may include a ferrite (see FIG. 10).

FIG. 10 is a diagram for showing an example of a cable having a ferrite.

The cable 6 shown in FIG. 10 has a ferrite F in addition to the n pieces of signal lines S1 to Sn, the inner shield 61, the outer shield 62, the insulator 63, and the capacitors C. The ferrite F is attached to the inner shield 61. The high-frequency noise mixed in the signal lines S1 to Sn can be further eliminated by the ferrite F.

Figure 11:
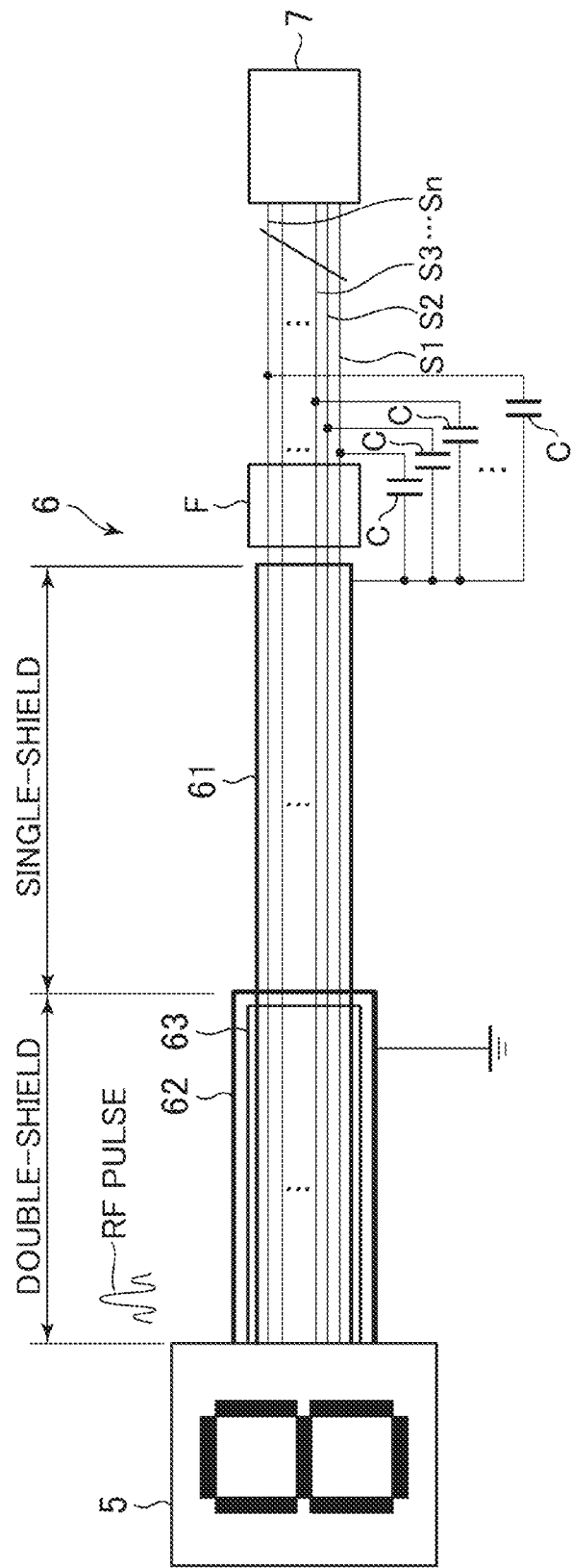
FIG. 11 is a diagram for showing another example of a cable having a ferrite.
Figure 12:
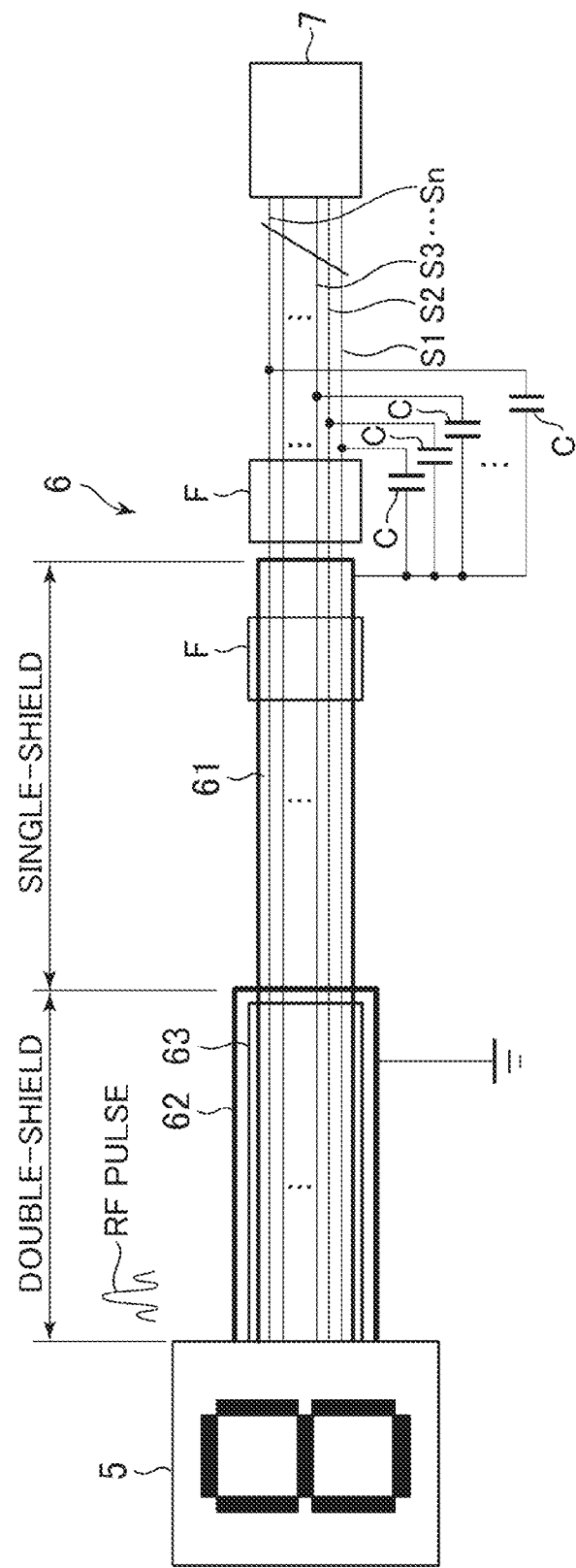
FIG. 12 is a diagram for showing still another example of a cable having ferrites.

It should be noted that although the ferrite F is attached to the inner shield 61 in FIG. 10, the ferrite F may be attached to the signal lines S1 to Sn (see FIG. 11), or may be attached to each of the inner shield 61 and the signal lines S1 to Sn (see FIG. 12).

Further, as noise elimination filters for eliminating the noise mixed in the signal lines S1 to Sn, the capacitors C (see FIG. 9), or the capacitors C and the ferrite F (see FIGS. 10 to 12) are exemplified in the third embodiment. However, components (for example, baluns) other than the capacitors C and the ferrite F may be used as noise elimination filters.

Many widely different embodiments may be configured without departing from the spirit and the scope of the present invention. It should be understood that the present invention is not limited to the specific embodiments described in the specification, except as defined in the appended claims.

The invention claimed is:

1. A magnetic resonance imaging apparatus configured to collect magnetic resonance signals from a human being, the apparatus comprising:
   a magnetic field generating device configured to generate a magnetic field within an accommodation space that is configured to accommodate the human being, wherein the magnetic field generating device is located in a shielded room, and wherein the accommodation space is enclosed by the magnetic field generating device and is defined by a table configured to support the human being and a sidewall that forms sides and a top of the accommodation space;
   an electronic display coupled to and conforming to the sidewall that forms the sides and the top of the accommodation space, the electronic display configured to display predetermined information for viewing by the human being;
   a control device located outside of the shield room and configured to control the electronic display; and
   a cable connecting the electronic display to the control device, the cable comprising:
      signal lines;
      an inner shield covering the signal lines and extending a first length; and
      an outer shield located outside of the inner shield and extending a second length that is less than the first length, wherein the outer shield is provided on a side of the cable proximate the electronic display, and wherein the inner shield and the outer shield form a double-shield structure.

2. The magnetic resonance imaging apparatus according to claim 1, wherein an external electronic display is coupled to and conforming to an external surface of the magnetic field generating device.

3. The magnetic resonance imaging apparatus according to claim 2, wherein the control device is configured to control the external electronic display, and wherein the cable connects the external electronic display to the control device.

4. The magnetic resonance imaging apparatus according to claim 1, wherein the cable further comprises an insulator between the inner shield and the outer shield.

5. The magnetic resonance imaging apparatus according to claim 3, wherein the cable further comprises an insulator between the inner shield and the outer shield.

6. The magnetic resonance imaging apparatus according to claim 1, wherein the cable further comprises noise elimination filters configured to eliminate noise from the signal lines.

7. The magnetic resonance imaging apparatus according to claim 4, wherein the cable further comprises noise elimination filters configured to eliminate noise from the signal lines.

8. The magnetic resonance imaging apparatus according to claim 6, wherein the noise elimination filters comprise one of capacitors, ferrites, and baluns.

9. The magnetic resonance imaging apparatus according to claim 1, wherein the electronic display is of an electrophoretic type.

10. A method of displaying information in a magnetic resonance imaging apparatus configured to collect magnetic resonance signals from a human being positioned within an accommodation space that is enclosed by a magnetic field generating device, wherein the magnetic field generating device is located in a shielded room, and wherein the accommodation space is defined by a table that supports the human being and a sidewall that forms sides and a top of the accommodation space, the method comprising:
providing an electronic display that is coupled to and conforming to the sidewall that forms the sides and the top of the accommodation space;
controlling the electronic display by transmitting signals through a cable that connects a control device located outside of the shielded room to the electronic display, the cable including signal lines, an inner shield covering the signal lines and extending a first length, and an outer shield located outside of the inner shield and extending a second length that is less than the first length, wherein the outer shield is provided on a side of the cable proximate the electronic display, and wherein the inner shield and the outer shield form a double-shield structure; and
displaying for viewing by the human being, predetermined information using the electronic display.

11. The magnetic resonance imaging apparatus according to claim 10, wherein the electronic display is configured to display a remaining scan time.

12. The magnetic resonance imaging apparatus according to claim 11, wherein the electronic display is further configured to display at least one of a field, a sky, and a forest.

13. The magnetic resonance imaging apparatus according to claim 2, wherein the external electronic display is configured to display at least one of a name of the human being, a weight of the human being, a date of birth of the human being, and a body weight of the human being.

14. The magnetic resonance imaging apparatus according to claim 1, wherein at least one capacitor is electrically coupled between the signal lines and the inner shield.

15. The method according to claim 10, wherein controlling the electronic display by transmitting signals through a cable comprises transmitting signals through a cable that includes at least one capacitor electrically coupled between the signal lines and the inner shield.

16. The magnetic resonance imaging apparatus according to claim 1, wherein the accommodation space is one of a tunnel-type accommodation space and an open-type accommodation space.

* * * * *